United States Patent
Rubin et al.

(10) Patent No.: US 10,310,012 B2
(45) Date of Patent: Jun. 4, 2019

(54) LIGHTWEIGHT, LOW OVERHEAD DEBUG BUS

(71) Applicant: Samsung Electronics Co., Ltd., Suwon-si, Gyeonggi-do (KR)

(72) Inventors: Lawrence H. Rubin, Austin, TX (US); David C. Tannenbaum, Austin, TX (US)

(73) Assignee: SAMSUNG ELECTRONICS CO., LTD. (KR)

(*) Notice: Subject to any disclaimer, the term of this patent is extended or adjusted under 35 U.S.C. 154(b) by 99 days.

(21) Appl. No.: 15/473,593

(22) Filed: Mar. 29, 2017

(65) Prior Publication Data
US 2018/0172765 A1    Jun. 21, 2018

Related U.S. Application Data

(60) Provisional application No. 62/437,530, filed on Dec. 21, 2016.

(51) Int. Cl.
*G01R 31/28* (2006.01)
*G01R 31/317* (2006.01)
*G06F 11/00* (2006.01)

(52) U.S. Cl.
CPC . *G01R 31/31704* (2013.01); *G01R 31/31705* (2013.01); *G06F 11/00* (2013.01)

(58) Field of Classification Search
CPC ........ G01R 31/31704; G01R 31/31705; G01R 31/31727; G01R 31/31726; G01R 31/31723; G01R 31/2884; G01R 31/3177
See application file for complete search history.

(56) References Cited

U.S. PATENT DOCUMENTS

| 9,274,169 B2 | 3/2016 | Lingannagari et al. |
| 2008/0126892 A1* | 5/2008 | Dubey ............... G11C 29/1201 714/718 |

(Continued)

OTHER PUBLICATIONS

Arm Limited, "ARM966E-S Technical Reference Manual", ARM DDI 0164A, 1999, 2 pages.

(Continued)

*Primary Examiner* — Thien Nguyen
(74) *Attorney, Agent, or Firm* — Renaissance IP Law Group LLP

(57) ABSTRACT

According to one general aspect, an apparatus may include an interconnect bus, an interconnect-to-debug bus interface, and a debug bus. The interconnect bus may be configured to connect and manage combinatorial logical blocks during normal operation of a processor and operate synchronous to a core clock. The interconnect-to-debug bus interface may be configured to translate communications between the interconnect bus and the debug bus. The debug bus may include a plurality of debug wrapper circuits arranged in a daisy chain for unidirectional communication, and configured to operate synchronous to the core clock. Each of the plurality of debug wrapper circuits may be configured to: identify if the respective debug wrapper circuit is activated by the debug bus, receive a non-invasive input from a respective combinatorial logic block, and place the non-invasive input from the respective combinatorial logic block on the debug bus.

20 Claims, 5 Drawing Sheets

(56) References Cited

U.S. PATENT DOCUMENTS

| | | | |
|---|---|---|---|
| 2012/0198291 A1* | 8/2012 | Dubey | G11C 29/1201 |
| | | | 714/718 |
| 2014/0189647 A1 | 7/2014 | Kaushik et al. | |
| 2015/0074313 A1 | 3/2015 | Morein et al. | |
| 2015/0082093 A1* | 3/2015 | Sarangi | G06F 11/27 |
| | | | 714/30 |
| 2015/0276868 A1* | 10/2015 | Sarangi | G01R 31/31705 |
| | | | 714/727 |

OTHER PUBLICATIONS

Wikipedia, the free encyclopedia, "Advanced Microcontroller Bus Architecture", last modified Dec. 29, 2016, 4 pages.

* cited by examiner

LIGHTWEIGHT, LOW OVERHEAD DEBUG BUS

CROSS-REFERENCE TO RELATED APPLICATION

This application claims priority under 35 U.S.C. § 119 to Provisional Patent Application Ser. No. 62/437,530, entitled "A LIGHTWEIGHT, LOW OVERHEAD DEBUG BUS" filed on Dec. 21, 2016. The subject matter of this earlier filed application is hereby incorporated by reference.

TECHNICAL FIELD

This description relates to design for debug (DFD), and more specifically to a lightweight, low overhead debug bus.

BACKGROUND

A graphics processing unit (GPU), occasionally called a visual processing unit (VPU), is a specialized electronic circuit designed to rapidly manipulate and alter memory to accelerate the creation of images in a frame buffer intended for output to a display device. GPUs are occasionally used in embedded systems, mobile phones, personal computers, workstations, and game consoles. Sometimes they are stand-alone integrated circuits, other times they are incorporated into larger devices, such as systems-on-a-chip (SoC). Modern GPUs are very efficient at manipulating computer graphics and image processing, and their highly parallel structure makes them more efficient than general-purpose CPUs for programs where the processing of large blocks of data is done in parallel.

Design for testing or design for testability (DFT) consists of integrated circuit (IC) design techniques that add testability features to a hardware product design. The added features make it easier to develop and apply manufacturing tests to the designed hardware. Often the purpose of manufacturing tests is to validate that the product hardware contains no manufacturing defects that could adversely affect the product's correct functioning.

In addition to being useful for manufacturing "go/no go" testing, the feature can also be used to "debug" chip designs. In this context, the chip is exercised in normal or functional mode (for example, a computer or mobile-phone chip might execute assembly language instructions). At any time, the chip may be re-configured into "test mode". At this point the full or partial internal state can be dumped out, or set to any desired values, by use of the DFT features. Another use of DFT to aid debug consists of scanning in an initial state to all memory elements and then going back to functional mode to perform system debug. The advantage is to bring the system to a known state without going through many clock cycles. This use of DFT features, along with the clock control circuits are a related sub-discipline of logic design called "Design for Debug" or "Design for Debuggability" (DFD).

SUMMARY

According to one general aspect, an apparatus may include an interconnect bus, an interconnect-to-debug bus interface, and a debug bus. The interconnect bus may be configured to connect and manage combinatorial logical blocks during normal operation of a processor and operate synchronous to a core clock. The interconnect-to-debug bus interface may be configured to translate communications between the interconnect bus and the debug bus. The debug bus may include a plurality of debug wrapper circuits arranged in a daisy chain for unidirectional communication, and configured to operate synchronous to the core clock. Each of the plurality of debug wrapper circuits may be configured to: identify if the respective debug wrapper circuit is activated by the debug bus, receive a non-invasive input from a respective combinatorial logic block, and place the non-invasive input from the respective combinatorial logic block on the debug bus.

According to another general aspect, a method may include transmitting a debug command via an interconnect bus configured to connect and manage combinatorial logical blocks during normal operation of a processor and operate synchronous to a core clock. The method may include translating the debug command between the interconnect bus and a debug bus. The he debug bus may include a plurality of debug wrapper circuits arranged in a daisy chain for unidirectional communication and that operate synchronous to the core clock. The method may also include, in response to the debug command, placing data from a selected debug wrapper circuit on the debug bus. The method may further include returning the data via the interconnect bus.

According to another general aspect, a system may include a graphic processing circuit, an interconnect bus, an interconnect-to-debug bus interface, and a debug bus. The graphic processing circuit may be configured to operate synchronous to a core clock, and manipulate and alter data in a memory to create images for output to a display device. The interconnect bus may be configured to connect and manage combinatorial logical blocks during normal operation of the graphic processing circuit and operate synchronous to the core clock. The interconnect-to-debug bus interface may be configured to translate communications between the interconnect bus and the debug bus. The debug bus may include a plurality of debug wrapper circuits arranged in a daisy chain for unidirectional communication, and configured to operate synchronous to the core clock. Each of the plurality of debug wrapper circuits may be configured to: identify if the respective debug wrapper circuit is activated by the debug bus, receive a non-invasive input from a respective combinatorial logic block, and place the non-invasive input from the respective combinatorial logic block on the debug bus.

The details of one or more implementations are set forth in the accompanying drawings and the description below. Other features will be apparent from the description and drawings, and from the claims.

A system and/or method for design for debug (DFD), and more specifically to a lightweight, low overhead debug bus, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
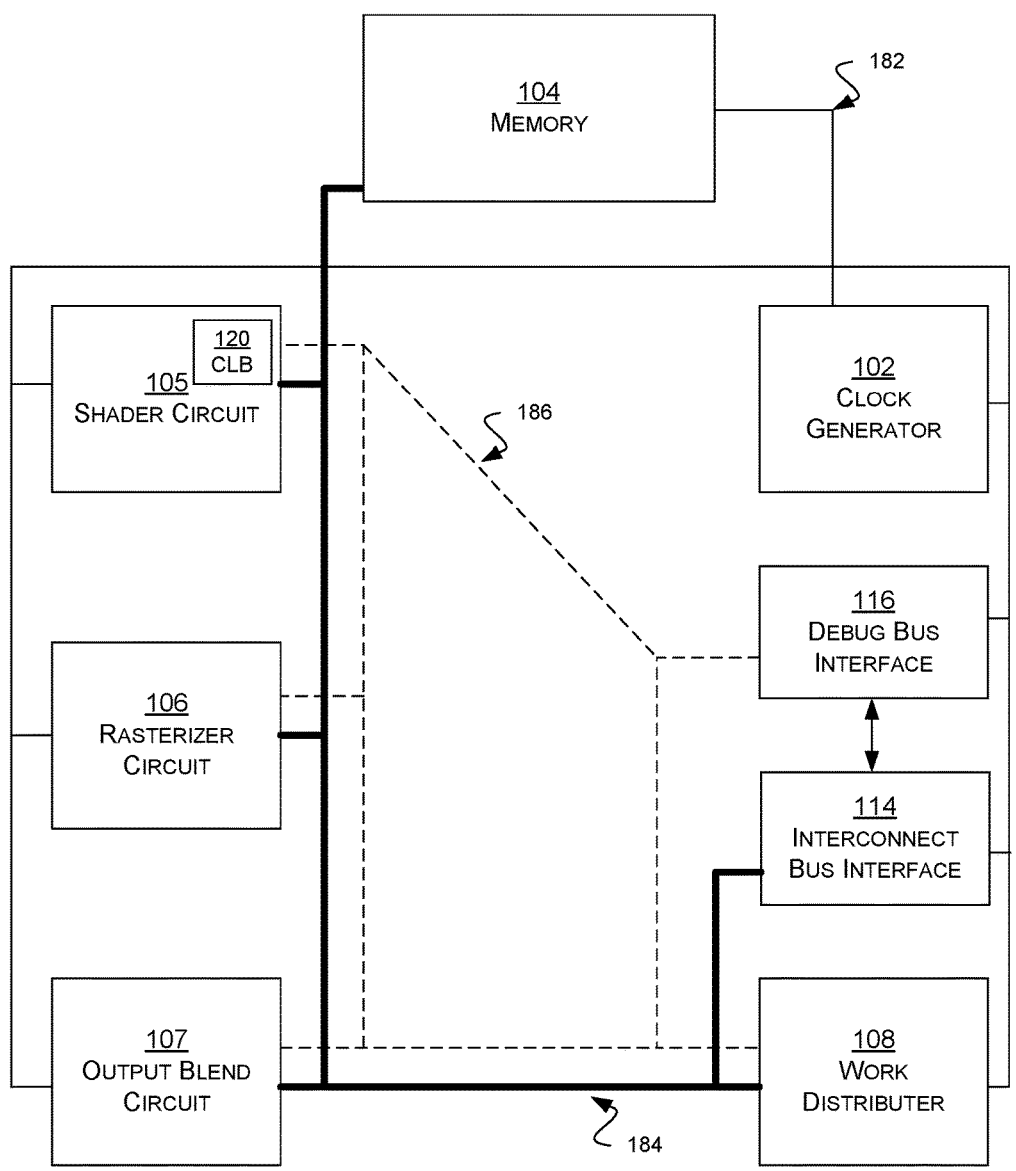
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In various embodiments, the system 100 may include a processor, such as a central processor or graphics processor, or more generally a system-on-a-chip (SoC). In the illustrated embodiment, the system 100 is shown as a graphics processor unit (GPU). It is understood that the above is merely one illustrative example to which the disclosed subject matter is not limited.

In various embodiments, the system 100 may include a memory 104, a clock generator 102, and a number of other functional unit blocs (FUBs). In the illustrated embodiment, the FUBs may include a shader circuit 105, a rasterizer circuit 106, an output blend circuit 107, and a work distributor 108. Each of these FUBs may themselves be or may include a number of combinatorial logic blocks (CLBs) 120. Each CBL 120 may include a combination of various pieces of Boolean logic and memory registers (e.g., latches, flip-flops) configured to perform a certain task or part of a larger task. It is understood that the above are merely a few illustrative examples to which the disclosed subject matter is not limited.

In the illustrated embodiment, the system 100 may include an interconnect bus 184 configured to connect and manage combinatorial logical blocks 120 or FUBs during normal operation of the system 100. In the illustrated embodiment, the interconnect bus 184 may be synchronized or controlled by the clock signal 182. Since this clock signal 182 controls the core FUBs of the system 100 it may be referred to as the core clock 182. In some embodiments, the interconnect bus 184 may be accessed (read from, written to) via an interconnect bus interface 114. In one specific embodiment, the interconnect bus 184 may include the Advance High-Performance Bus (AHB) often employed in an Advance RISC Machines (ARM) processor. It is understood that the above is merely one illustrative example to which the disclosed subject matter is not limited.

Modern GPUs tend to be intensely parallel machines with numerous instances of internal sub-units (e.g., shader circuit 105, rasterizer circuit 106). This makes conventional debug bus mechanisms very cumbersome to be used naively. Furthermore, a system network or interconnect bus 184 that is already present for normal operation cannot be easily depended on for debugging. Instead a separate, extremely lightweight, mechanism is desired to provide a path to extract debug information from each of the many sub-units in the system 100.

Figure 2:
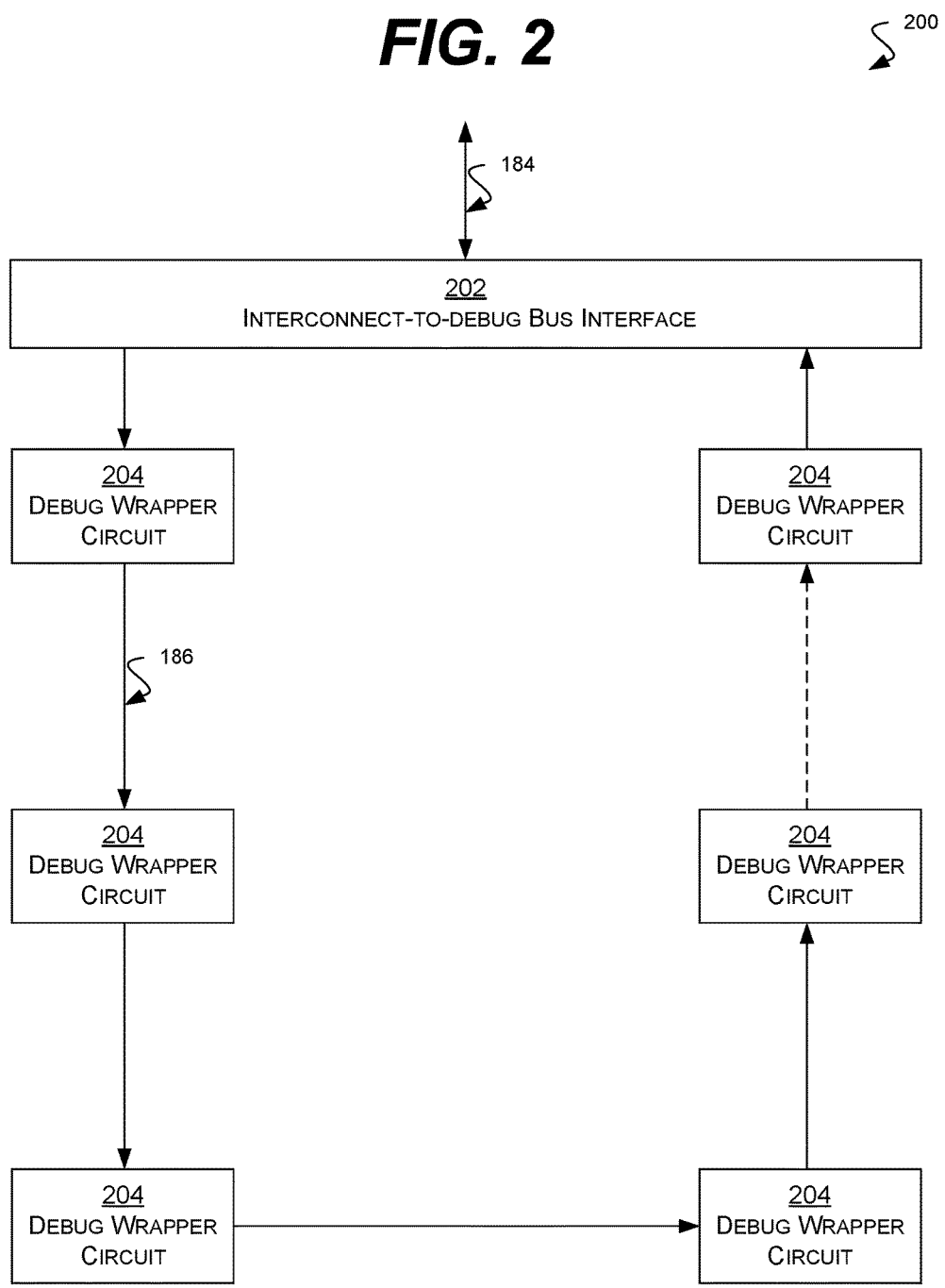
FIG. 2 is a block diagram of an example embodiment of a system in accordance with the disclosed subject matter.

In various embodiments, the system 100 may include a debug bus 186. As shown in FIG. 2 (discussed hereafter), the debug bus 186 may include a plurality of debug wrapper circuits (shown in FIG. 2). Each debug wrapper circuit may be configured to access internal registers or signals from the various CLBs 120, and route them to a user or debugging analyzer (off chip). In the illustrated embodiment, the debug bus 186 may operate or be synchronized to the core clock 182, as opposed to a slower testing clock as is done in other designs.

Further, in various embodiments, the debug bus 186 may be accessed via the interconnect bus 184. Commands may be placed on the interconnect bus 184 and then passed to the debug bus 186 via the interconnect bus interface 114 and the debug bus interface 116. Likewise, when data is returned from the debug bus 186 it may be passed to the interconnect bus 184 via the debug bus interface 116 and the interconnect bus interface 114. In such an embodiment, the debug information may be placed into the memory 104 (either via the interconnect bus 184 or a FUB that writes to the memory 104) or otherwise retrieved during normal (i.e., non-debug) operation.

FIG. 2 is a block diagram of an example embodiment of a system 200 in accordance with the disclosed subject matter. In various embodiments, the architecture of the debug bus 186 is discussed.

The system 200 may include an interconnect-to-debug bus (IDB) interface 202. The interconnect-to-debug bus interface 202 may be configured to translate communications between the interconnect bus 184 and the debug bus 186. In various embodiments, the two buses 184 and 186 may employ different protocols and different signals.

In such an embodiment, the IDB interface 202 may be configured to re-align signals (e.g., from the $10^{th}$ bit position to the $2^{nd}$ bit position). In some embodiments, the IDB interface 202 may be configured to generate new signals. For example, the IDB interface 202 may determine if a field has a particular value in the interconnect bus 184 and create, based upon the field, a signal that has meaning on the debug bus 186. In a specific example, if the AHB embodiment of the interconnect bus 184 indicates the AHB is operating in a non-sequential (NONSEQ) mode, the IDB interface 202 may generate a signal that enables the debug bus 186. If the AHB transaction mode (HTRANS) signal does not equal NONSEQ, the debug bus 186 may remain inactive or even un-clocked (i.e., in a low power mode). In yet another embodiment, the IDB interface 202 may pull data off particular fields of the interconnect bus 184 and reformat them to the debug bus 186 (e.g., a debug wrapper circuit 204 address value. In such an embodiment, the IDB interface 202 may preform similar operations when retrieving information from the debug bus 186 and initiating a transaction on the interconnect bus 184. It is understood that the above are merely a few illustrative examples to which the disclosed subject matter is not limited.

In the illustrated embodiment, the system 200 or debug bus 186 may include a plurality of debug wrapper circuits 204. Each debug wrapper circuit 204 may be configured to determine if a debug bus 204 transaction is targeted to it, and, if so, non-invasively retrieve data from a respective CLB and place that data on the debug bus 186.

In various embodiments, the debug wrapper circuits 204 may be arranged in a daisy-chain fashion or connected in a linear series. Further, in some embodiments, the debug bus 186 may only support unidirectional communication. In such an embodiment, the debug bus 186 may support bi-directional or even multi-directional communication.

In various embodiments, the interconnect bus 184 may involve single-cycle transactions, and may not be retimed by adding flip-flops or other timing elements to the bus 184. This may impede the ability of a debug engineer to inspect various CLBs or add/remove CLBs to the DFD inspection system. Conversely, with the debug bus 186 operating as a unidirectional, multi-cycle bus made up of daisy-chained debug wrapper circuits 204, it is easy to add/remove debug wrapper circuits 204 (and their associated CLBs) from the debug bus 186.

In one embodiment, the addition/removal of debug wrapper circuits 204 may only be done during the design phase of the system's creation. However, in another embodiment, the debug bus 186 may allow for dynamic addition/removal of debug wrapper circuits 204.

In various embodiments, the debug bus 186 may only support one outstanding transaction on the chain at a time. In such an embodiment, the need for any local buffering or push-back mechanisms may be avoided. Because the debug bus 186 is employed only during testing and debugging, the performance requirements may be less of a priority than those of the interconnect bus 184, which is used during normal (i.e., non-debug) operation (e.g., by a customer). Conversely, in some embodiments, the debug bus 186 may support pipelining or multi-cycle operations or transactions.

While the debug bus 186 is primarily discussed as performing only a read function (i.e. retrieving data from a CLB), in various embodiments, the debug bus 186 may also be configured to perform write operations. In such an embodiment, the debug bus 186 protocol may include sending a target address on a first cycle and then sending data to be written on a second cycle. In the case of a time-multiplexed protocol, data may be sent every cycle after the first cycle until a new address is presented. It is understood that the above is merely one illustrative example to which the disclosed subject matter is not limited.

In some embodiments, the daisy-chained topology of the debug bus 186 may allow the exact ordering or routing of the debug bus 186 to be easily changed. In such an embodiment, the ordering of the debug wrapper circuits 204 may be changed (e.g., during the design phase) due to routing concerns. It is understood that the above is merely one illustrative example to which the disclosed subject matter is not limited.

Figure 3:
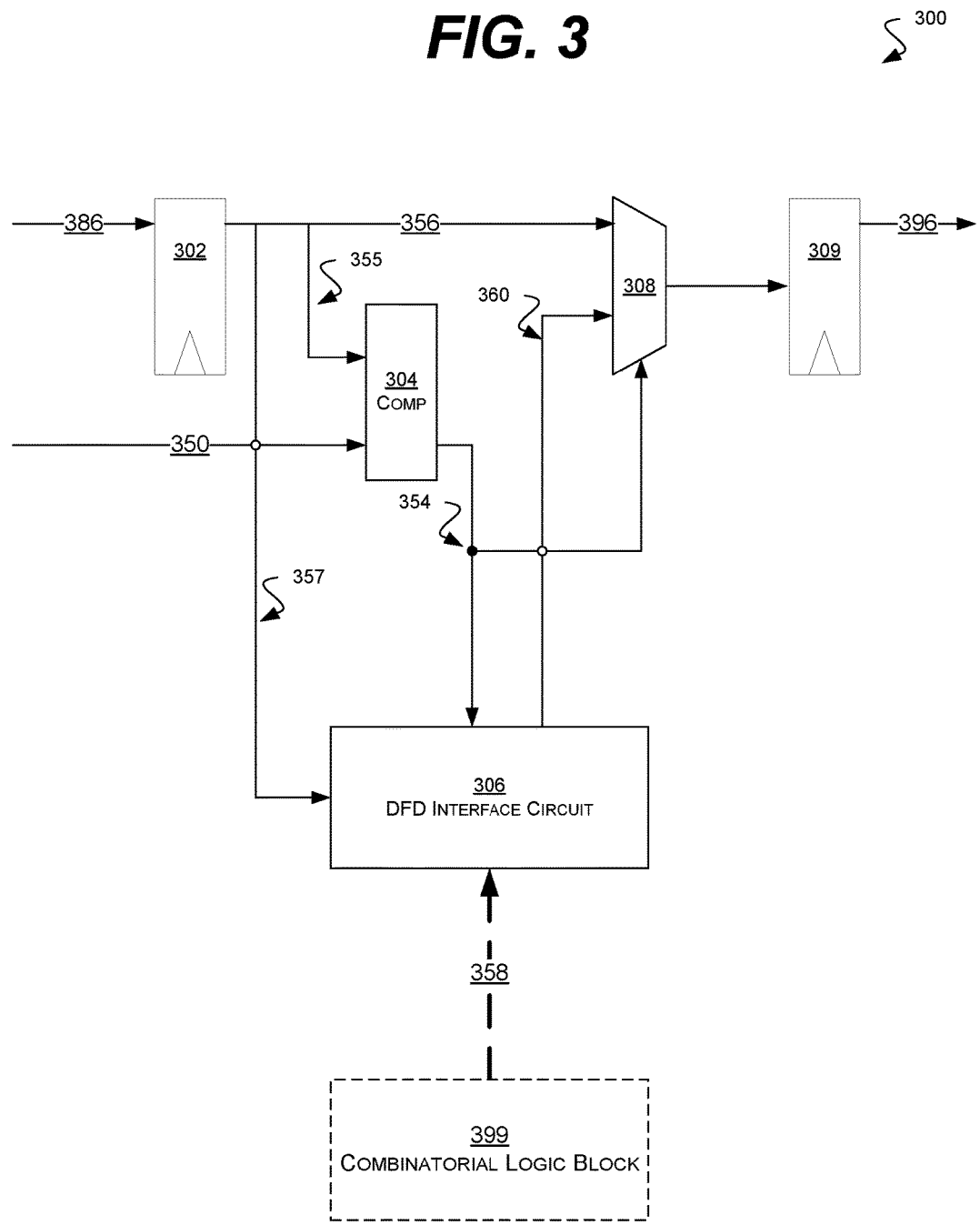
FIG. 3 is a block diagram of an example embodiment of a system in accordance with the disclosed subject matter.

FIG. 3 is a block diagram of an example embodiment of a system 300 in accordance with the disclosed subject matter. In the illustrated embodiment, the system 300 may include an embodiment of a debug wrapper circuit, as shown in FIG. 2. It is understood that the above is merely one illustrative example to which the disclosed subject matter is not limited.

In one embodiment, the debug bus 386 may enter the system 300 from the prior debug wrapper circuit in the daisy-chain (not shown). In such an embodiment, the debug bus 386 may be buffered by the flip-flop (or other timing element) 302. In such an embodiment, the flip-flop 302 may be controlled by the core clock, as described above.

In the illustrated embodiment, the debug bus 386 (and its variations 356 and 396) may include 18 signals. This may involve a light or un-burdensome amount of routing to produce the debug bus (as compared to the interconnect bus). In such an embodiment, the 18 signals may include an activation or enablement bit (HSEL_RDY), 5-bits of target address information (HADDR[10:6]), 3-bits of time multiplexing or dataset selection information (HADDR[5:3]), a data valid bit (HVALID), and 8-bits of returned data (HDATA[7:0]). It is understood that the above is merely one illustrative example to which the disclosed subject matter is not limited.

In the illustrated embodiment, the target address information 355 is pulled off the buffered debug bus 356 and compared to a semi-static debug wrapper identifier (ID) 350. The comparison may be performed by the comparator 304.

If the target address 355 is not a match, the multiplexer 308 may pass the unchanged buffered debug bus 356 to the next debug wrapper circuit (not shown). The flip-flop 309 may again buffer the debug bus 356 before transmitting as debug bus 396. In various embodiments, one or both of the flip-flops 302 and 309 may be removed (e.g., due to timing concerns). Or alternatively more flip-flops may be added (e.g., in between debug wrapper circuits to break capacitive loads). Although, as timing is not much of a concern for the debug, bus such flip-flop modifications may not be desired.

If the target address 355 does match however, the debug enable bit (HSEL_RDY) and the time multiplexing or dataset selection information (HADDR[5:3]) (collectively referred to as read enable bits 357) may be passed to the DFD interface circuit 306. Likewise, an address match signal 354 may also be passed to the DFD interface circuit 306.

The DFD interface circuit 306 may be configured to receive a non-invasive input 358 from a respective combinatorial logic block (CLB) 399. In the illustrated embodiment, the CLB 399 may not be included in the system 300. The DFD interface circuit 306 is discussed more in relation to FIG. 4, below.

As described below, the DFD interface circuit 306 may receive a relatively large number of bits of inputs 358 from the CLB 399. The width of the inputs 358 may be too great for the debug bus 396 to handle simultaneously. In such an embodiment, the DFD interface circuit 306 may be configured to select a sub-portion of the inputs 358 and may place those selected inputs 360 on the debug bus 396. In the illustrated embodiment, the selection is done via time multiplexing and the selection bits (HADDR[5:3]); it is understood that the above is merely one illustrative example to which the disclosed subject matter is not limited.

In the illustrated embodiment, the MUX 308 may be configured to merge the selected inputs 360 with the unaltered signal portions of the buffered debug bus 356. For example, the selected inputs 360 may be placed on the debug bus 356 as the returned data (HDATA[7:0]) data. The valid bit (HVALID) may be included in the selected inputs 360 (or as an unillustrated companion signal) or may be generated by the MUX 308. It is understood that the above are merely a few illustrative examples to which the disclosed subject matter is not limited.

Figure 4:
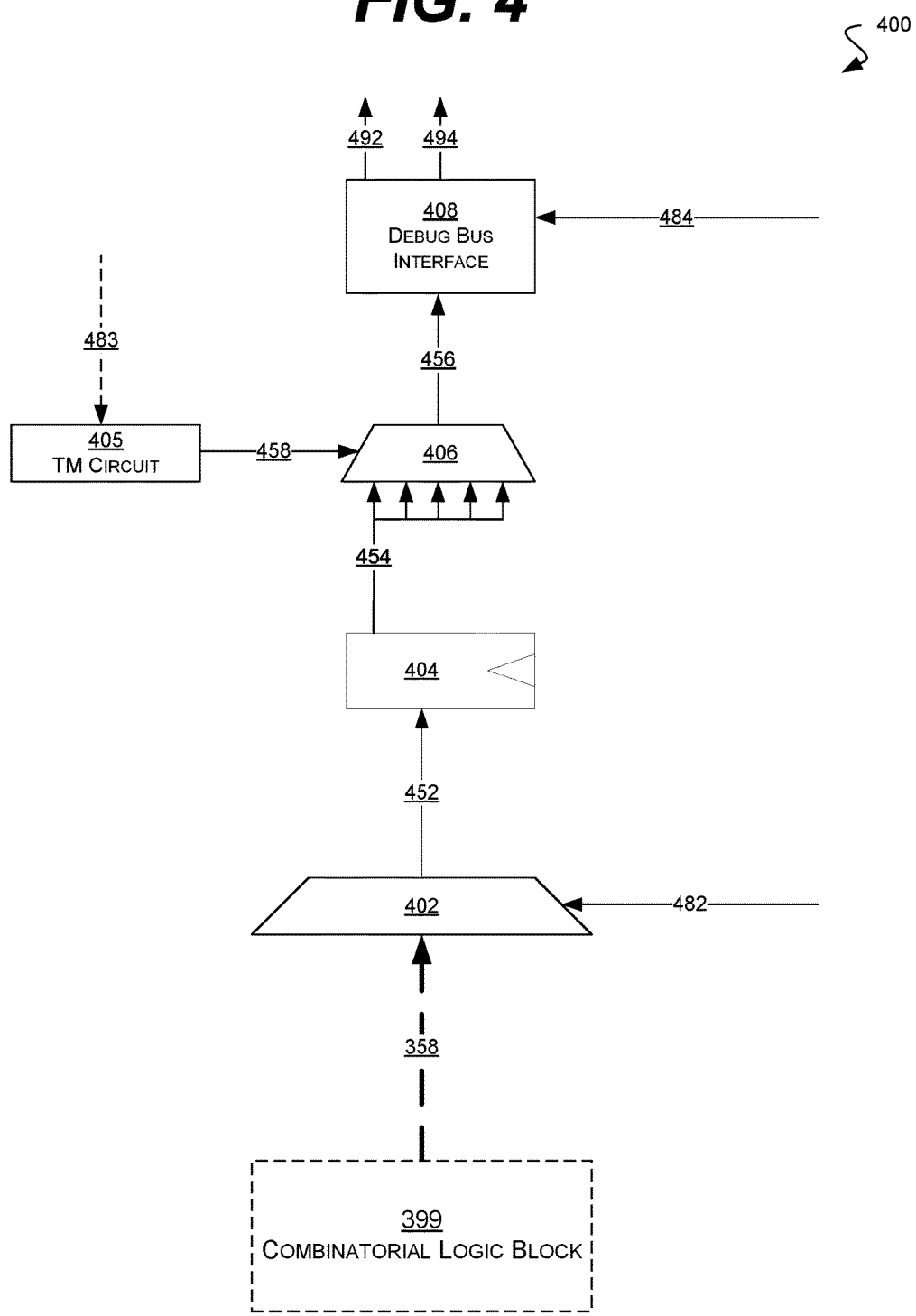
FIG. 4 is a block diagram of an example embodiment of a system in accordance with the disclosed subject matter.

FIG. 4 is a block diagram of an example embodiment of a system 400 in accordance with the disclosed subject matter. In the illustrated embodiment, the system 400 may include an embodiment of a DFD interface circuit, as shown in FIG. 3. It is understood that the above is merely one illustrative example to which the disclosed subject matter is not limited.

In the illustrated embodiment, the system 400 may receive, in a non-invasive manner, input signals 358 from the CLB 399. These signals 358 may be selected by the designer of the CLB or the DFD engineer. They may include outputs/inputs to Boolean logic circuits, and/or register or timing element (e.g., flip-flops, latches) values. It is understood that the above are merely a few illustrative examples to which the disclosed subject matter is not limited.

In the illustrated embodiment, the inputs 358 may include 8 groups of 64-bit signals. It is understood that the above is merely one illustrative example to which the disclosed subject matter is not limited. Which of these 8 groups is then passed to the debug bus (not shown) may be determined by the selection bits 482 (HADDR[5:3]). The selection may be performed by the MUX 402. These selected group of inputs 452 may then be buffered by the flip-flop 404. Again, the flip-flop 404 and the system 400 may operate based upon the core clock.

As described above, in one embodiment, the group of inputs 358 may include 64-bits. But the debug bus may only have room for 8-bits of data at a time. It is understood that the above is merely one illustrative example to which the disclosed subject matter is not limited. Therefore, the MUX 406 may select a sub-group or portion of the buffered inputs 454 to pass to the debug bus during any given clock cycle.

In the illustrated embodiment, the system 400 may accomplish this by time multiplexing the debug bus data bits. This may be done via the time-multiplexing (TM) circuit 405 generating the selection signal 458. The MUX 406 may then, every clock cycle, select the $1^{st}$ 8-bits of signal 454, and then the $2^{nd}$ 8-bit of signal 454, and so forth until all the bits of signal 454 have been transmitted to the debug bus.

In various embodiments, other selection schemes may be employed. For example, in one embodiment, the debug bus may include time multiplexing bits 483 configured to select which of portion the buffered inputs 454 to pass to select as selected outputs 456. In another embodiment, some form of encoding may be performed. It is understood that the above are merely a few illustrative examples to which the disclosed subject matter is not limited.

In the illustrated embodiment, the selected outputs 456 may be processed by the debug bus interface 408. In such an embodiment, the debug bus interface 408 may be configured to package the selected outputs 456 for the debug wrapper circuit (shown in FIG. 3). In such an embodiment, the debug bus interface 408 may place the selected outputs 456 on the returned data signal 494 (to eventually be HDATA), and enable the valid bit 492 (to eventually be HVALID) if data is ready to be placed on the debug bus.

In one embodiment, the debug bus interface 408 may only active when the activation or enablement bit 484 (HSEL_RDY) is enabled. In various embodiments, the HSEL_RDY signal may be ANDed with the address match result (shown in FIG. 3) to form the enable signal 484. In some embodiments, the enable signal 484 may only control the debug bus interface 408, whereas, in another embodiment, it may gate the clock to the flip-flop 404 and other circuitry. It is understood that the above are merely a few illustrative examples to which the disclosed subject matter is not limited.

Various embodiments of the disclosed subject matter have been described herein. However, it is understood that the above are merely a few illustrative examples to which the disclosed subject matter is not limited. Other variations may include, but are not limited to, widening or narrowing the width of the debug bus to increase or reduce the buses bandwidth. In another embodiment, the address and data portions of the debug bus may be merged such that the first cycle of the transaction has the address on the address/data lines. This was described for the write case, but may occur in other embodiments. This may cause an added cycle of latency at the benefit of reducing the bus width, and improving the routing characteristics of the bus. As described above, commands may be pipelined which would allow for automated tools to make periodic snapshots of the CLB register/signal states. It is understood that the above are merely a few illustrative examples to which the disclosed subject matter is not limited.

Figure 5:
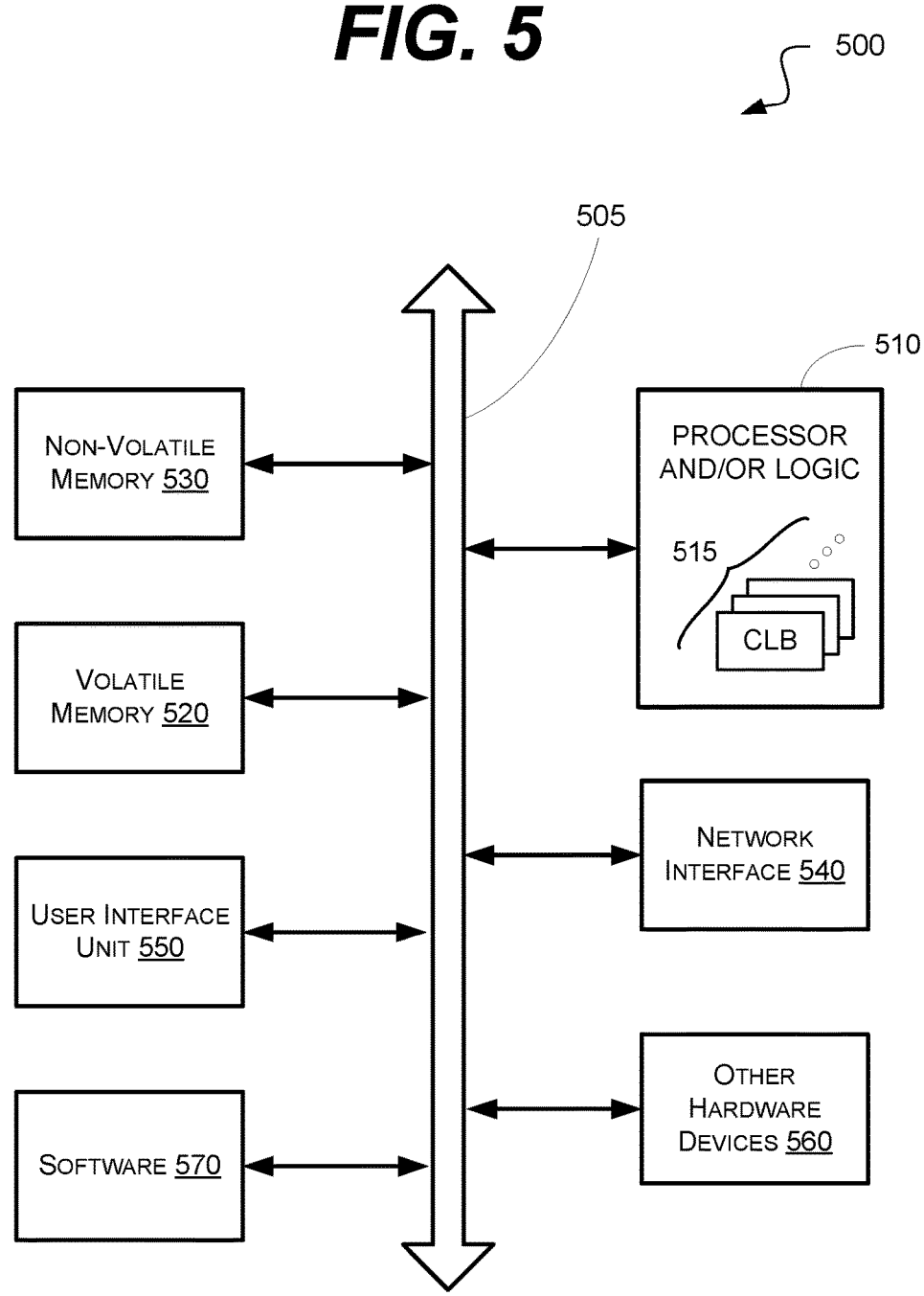
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM)). The information processing system 500 according to the disclosed subject matter may further include a non-volatile memory 530 (e.g., a hard drive, an optical memory, a NAND or Flash memory). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+). Examples of a wired protocol may include, but are not limited to, IEEE 802.3 (a.k.a. Ethernet), Fibre Channel, Power Line communication (e.g., HomePlug, IEEE 1901). It is understood that the above are merely a few illustrative examples to which the disclosed subject matter is not limited.

The information processing system 500 according to the disclosed subject matter may further include a user interface unit 550 (e.g., a display adapter, a haptic interface, a human interface device). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540) of the information processing system 500. In such an embodiment, the information processing system 500 may include one or more native applications, which may be installed locally (e.g., within the non-volatile memory 530) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
an interconnect bus configured to connect to combinatorial logical blocks during normal operation of a processor and operate synchronous to a core clock;
an interconnect-to-debug bus interface configured to translate communications between the interconnect bus and a debug bus;
the debug bus comprising a plurality of debug wrapper circuits arranged in a daisy chain for unidirectional communication, and configured to operate synchronous to the core clock; and
wherein each of the plurality of debug wrapper circuits is configured to:
identify if the respective debug wrapper circuit is activated by the debug bus,
receive a non-invasive input from a respective combinatorial logic block, and
place the non-invasive input from the respective combinatorial logic block on the debug bus.

2. The apparatus of claim 1, wherein each of the debug wrapper circuits comprises:
a designed-for-debug interface circuit configured to, upon activation by the debug bus, time multiplex a first number of non-invasive signals from a respective combinatorial logic block to a second number of debug output signals.

3. The apparatus of claim 1, wherein each of the debug wrapper circuits comprises:
a comparator configured to determine, based upon an fixed identifier, if a respective debug wrapper circuit is activated by the debug bus; and
a multiplexer configured to, based upon whether or not the respective debug wrapper circuit is activated, forward a communication on the debug bus to a next debug wrapper circuit, or place the non-invasive input from the respective combinatorial logic block on the debug bus.

4. The apparatus of claim 1, wherein the debug bus is configured to transmit a debug wrapper circuit address on a first clock cycle, and transmit data on a second clock cycle.

5. The apparatus of claim 1, wherein the debug bus comprises a plurality of re-routing circuits, wherein each re-routing circuit is configured to bypass a respective debug wrapper circuit, such that the respective debug wrapper circuit is temporarily removed from the debug bus.

6. The apparatus of claim 1, wherein each of the debug wrapper circuits comprises a synchronous circuit, operating at the core clock, and configured to separate the plurality of debug wrapper circuits from each other.

7. The apparatus of claim 1, wherein each of the debug wrapper circuits is configured to only be activated if the interconnect bus is placed in a first transfer mode, wherein the first transfer mode is also employed for non-debug communication.

8. A method comprising:
transmitting a debug command via an interconnect bus configured to connect to combinatorial logical blocks during normal operation of a processor and operate synchronous to a core clock;
translating the debug command between the interconnect bus and a debug bus, wherein the debug bus comprises a plurality of debug wrapper circuits arranged in a daisy chain for unidirectional communication and that operate synchronous to the core clock;
in response to the debug command, placing data from a selected debug wrapper circuit on the debug bus; and
returning the data via the interconnect bus.

9. The method of claim 8, wherein each of the plurality of debug wrapper circuits is configured to:
identify if the respective debug wrapper circuit is activated by the debug bus, receive a non-invasive input from a respective combinatorial logic block, and place the non-invasive input from the respective combinatorial logic block on the debug bus.

10. The method of claim 9, wherein each of the debug wrapper circuits comprises:

a designed-for-debug interface circuit configured to, upon activation by the debug bus, time multiplex a first number of non-invasive signals from a respective combinatorial logic block to a second number of debug output signals.

11. The method of claim 8, wherein each of the debug wrapper circuits comprises:

a comparator configured to determine, based upon an fixed identifier, if a respective debug wrapper circuit is activated by the debug bus; and a multiplexer configured to, based upon whether or not the respective debug wrapper circuit is activated, forward a communication on the debug bus to a next debug wrapper circuit, or place the non-invasive input from the respective combinatorial logic block on the debug bus.

12. The method of claim 8, wherein placing data from a selected debug wrapper circuit on the debug bus comprises:

transmitting a debug wrapper circuit address on a first clock cycle, and transmitting data on a second clock cycle.

13. The method of claim 8, wherein the debug bus comprises a plurality of re-routing circuits, wherein each re-routing circuit is configured to bypass a respective debug wrapper circuit, such that the respective debug wrapper circuit is temporarily removed from the debug bus.

14. The method of claim 8, translating the debug command between the interconnect bus and a debug bus comprises:

activating the debug bus only if the interconnect bus is placed in a first transfer mode, and wherein the first transfer mode is also employed for non-debug communication.

15. A system comprising:

a graphic processing circuit configured to operate synchronous to a core clock, and manipulate and alter data in a memory to create images for output to a display device;

an interconnect bus configured to connect to combinatorial logical blocks during normal operation of the graphic processing circuit and operate synchronous to the core clock;

an interconnect-to-debug bus interface configured to translate communications between the interconnect bus and a debug bus;

the debug bus comprising a plurality of debug wrapper circuits arranged in a daisy chain for unidirectional communication, and configured to operate synchronous to the core clock; and wherein each of the plurality of debug wrapper circuits is configured to:

identify if the respective debug wrapper circuit is activated by the debug bus, receive a non-invasive input from a respective combinatorial logic block, and place the non-invasive input from the respective combinatorial logic block on the debug bus.

16. The system of claim 15, wherein each of the debug wrapper circuits comprises:

a designed-for-debug interface circuit configured to, upon activation by the debug bus, time multiplex a first number of non-invasive signals from a respective combinatorial logic block to a second number of debug output signals.

17. The system of claim 15, wherein each of the debug wrapper circuits comprises:

a comparator configured to determine, based upon a fixed identifier, if a respective debug wrapper circuit is activated by the debug bus; and a multiplexer configured to, based upon whether or not the respective debug wrapper circuit is activated, forward a communication on the debug bus to a next debug wrapper circuit, or place the non-invasive input from the respective combinatorial logic block on the debug bus.

18. The system of claim 15, wherein the debug bus is configured to transmit a debug wrapper circuit address on a first clock cycle, and transmit data on a second clock cycle.

19. The system of claim 15, wherein the debug bus comprises a plurality of re-routing circuits, wherein each re-routing circuit is configured to bypass a respective debug wrapper circuit, such that the respective debug wrapper circuit is temporarily removed from the debug bus.

20. The system of claim 15, wherein each of the debug wrapper circuits is configured to only be activated if the interconnect bus is placed in a first transfer mode, wherein the first transfer mode is also employed for non-debug communication.

* * * * *